(12) United States Patent
Muchherla et al.

(10) Patent No.: US 11,810,627 B2
(45) Date of Patent: Nov. 7, 2023

(54) SELECTIVE READ DISTURB SAMPLING

(71) Applicant: Micron Technology, Inc., Boise, ID (US)

(72) Inventors: Kishore Kumar Muchherla, Fremont, CA (US); Harish R. Singidi, Fremont, CA (US); Renato C. Padilla, Folsom, CA (US); Vamsi Pavan Rayaprolu, San Jose, CA (US); Ashutosh Malshe, Fremont, CA (US); Sampath K. Ratnam, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/886,884

(22) Filed: Aug. 12, 2022

(65) Prior Publication Data

US 2022/0383962 A1 Dec. 1, 2022

Related U.S. Application Data

(63) Continuation of application No. 16/718,051, filed on Dec. 17, 2019, now Pat. No. 11,450,392.

(51) Int. Cl.
*G11C 16/34* (2006.01)
*G11C 16/08* (2006.01)
(Continued)

(52) U.S. Cl.
CPC ........ *G11C 16/3431* (2013.01); *G06F 11/076* (2013.01); *G06F 11/3037* (2013.01);
(Continued)

(58) Field of Classification Search
CPC . G11C 16/3431; G11C 16/08; G11C 16/3427; G11C 16/349; G11C 16/26;
(Continued)

(56) References Cited

U.S. PATENT DOCUMENTS 6,163,475 A * 12/2000 Proebsting .......... G11C 11/4091
365/69
10,848,263 B2   11/2020 Shih
(Continued)

FOREIGN PATENT DOCUMENTS

EP           490651 A2 *  6/1992 ........... G11C 11/419

OTHER PUBLICATIONS

Zhou et al., A New 10T SRAM Cell with Improved Read/Write Margin and No Half Select Disturb for BitInterleaving Architecture, 2012, Applied Mechanics and Materials. All pages. (Year: 2012).*

*Primary Examiner* — Michael T Tran
(74) *Attorney, Agent, or Firm* — Lowenstein Sandler LLP

(57) ABSTRACT

A processing device in a memory system maintains a counter to track a number of read operations performed on a data block of a memory device and determines that the number of read operations performed on the data block satisfies a first threshold criterion. The processing device further determines whether a number of scan operations performed on the data block satisfies a scan threshold criterion. Responsive to the number of scan operations performed on the data block satisfying the scan threshold criterion, the processing device performs a first data integrity scan to determine one or more first error rates for the data block, each of the one or more first error rates corresponding to a first set of wordlines of the data block, the first set comprising first alternating pairs of adjacent wordlines.

17 Claims, 9 Drawing Sheets

(51) Int. Cl.
*G06F 11/30* (2006.01)
*G06F 11/07* (2006.01)

(52) U.S. Cl.
CPC ............ *G11C 16/08* (2013.01); *G11C 16/349* (2013.01); *G11C 16/3427* (2013.01)

(58) Field of Classification Search
CPC ............... G11C 16/3422; G06F 11/076; G06F 11/3037; G06F 2201/88; G06F 11/073; G06F 11/3409
USPC ........................ 365/185.09, 189.05
See application file for complete search history.

(56) References Cited

U.S. PATENT DOCUMENTS

| | | | |
|---|---|---|---|
| 11,321,014 | B2 | 5/2022 | Moon |
| 11,321,431 | B2 | 5/2022 | Liu et al. |
| 11,321,475 | B2 | 5/2022 | Pope et al. |
| 11,322,206 | B2 | 5/2022 | Hong et al. |
| 11,322,210 | B2 | 5/2022 | Takada et al. |
| 11,322,219 | B2 | 5/2022 | Chung et al. |
| 11,322,221 | B2 | 5/2022 | Ohyama et al. |
| 2003/0146461 | A1* | 8/2003 | Beer ...................... H10B 12/09 257/E21.651 |
| 2014/0136883 | A1 | 5/2014 | Cohen |
| 2016/0141029 | A1 | 5/2016 | Navon et al. |
| 2018/0341553 | A1 | 11/2018 | Koudele et al. |
| 2018/0374549 | A1* | 12/2018 | Padilla ............... G11C 16/3422 |
| 2019/0103164 | A1 | 4/2019 | Malshe et al. |
| 2019/0189202 | A1 | 6/2019 | Avraham et al. |
| 2020/0097394 | A1 | 3/2020 | Eno et al. |
| 2020/0151040 | A1 | 5/2020 | Lee et al. |
| 2020/0152282 | A1 | 5/2020 | Yang et al. |
| 2020/0202938 | A1 | 6/2020 | Reina |
| 2020/0344019 | A1 | 10/2020 | Da Silva et al. |
| 2022/0129187 | A1* | 4/2022 | Miller ................... G06F 3/0604 |
| 2022/0138044 | A1 | 5/2022 | Luo et al. |
| 2022/0139481 | A1 | 5/2022 | Rayaprolu et al. |

* cited by examiner

US 11,810,627 B2

SELECTIVE READ DISTURB SAMPLING

RELATED APPLICATIONS

This application is a continuation of U.S. patent application Ser. No. 16/718,051, filed Dec. 17, 2019, the entire contents of which are incorporated herein by reference.

TECHNICAL FIELD

Embodiments of the disclosure relate generally to memory sub-systems, and more specifically, relate to selective read disturb sampling in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
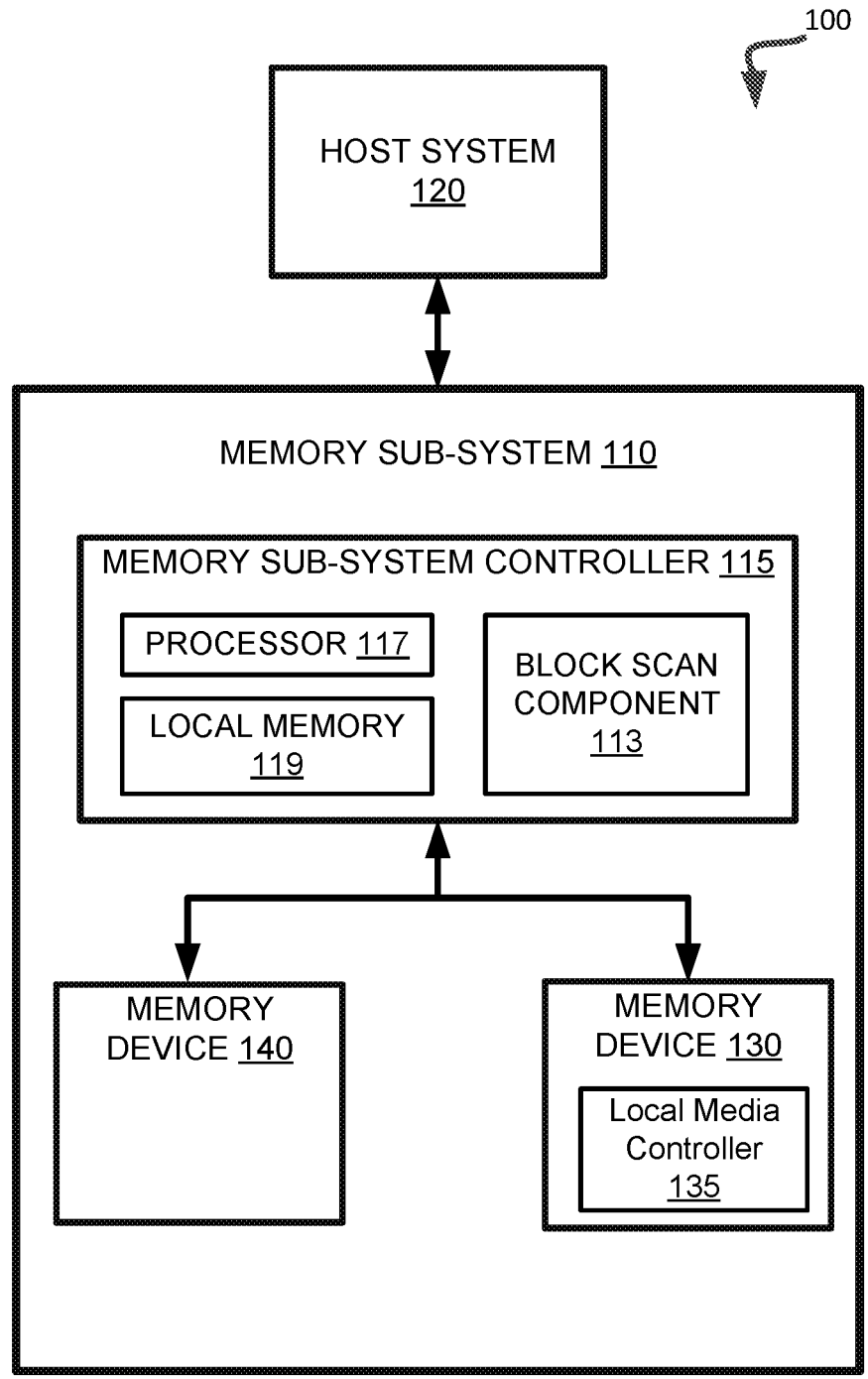
FIG. 1 illustrates an example computing system that includes a memory sub-system in accordance with some embodiments of the present disclosure.

Aspects of the present disclosure are directed to selective read disturb sampling in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A data block hereinafter refers to a unit of the memory device used to store data and can include a group of memory cells, a word line group, a word line, or individual memory cells. Memory pages (also referred to herein as "pages") store one or more bits of binary data corresponding to data received from the host system. The memory cells of a data block can be arranged along a number of separate wordlines. When data is written to a memory cell of the memory device for storage, a voltage is applied to the wordline on which the memory cell is located, causing the memory cells on that wordline to deteriorate. Accordingly, the memory cells of each wordline of the memory device can handle a finite number of write operations performed before the memory cells are no longer able to reliably store data. Data stored at the memory cells of the memory device can be read from the memory component and transmitted to a host system. When data is read from a memory cell on a given wordline of the memory device, the memory cells on all of the other word lines on the memory device can experience what is known as read disturb. Read disturb is the result of continually reading from memory cells without intervening erase operations, causing other memory cells on other nearby wordlines to change over time (e.g., become programmed). Those wordlines closer to (e.g., adjacent to) the wordline being read can experience higher levels of read disturb than other wordlines located further away. If too many read operations are performed on the memory cells of a given wordline, data stored at memory cells of nearby or adjacent wordlines of the memory device can become corrupted or incorrectly stored at the memory cell. This can result in a higher error rate of the data stored at the memory cells and can increase the use of an error detection and correction operation (e.g., an error control operation) for subsequent operations (e.g., read and/or write) performed on the memory cells. The increased use of the error control operation can result in a reduction of the performance of a conventional memory sub-system. In addition, as the error rate for a memory cell or data block continues to increase, it may even surpass the error correction capabilities of the memory sub-system, leading to an irreparable loss of the data. Furthermore, as more resources of the memory sub-system are used to perform the error control operation, fewer resources can be used to perform other read operations or write operations.

The error rate associated with data stored at the data block can increase due to read disturb. Therefore, upon a threshold number of read operations being performed on the data block, the memory sub-system can perform a data integrity check (also referred to herein as a "scan") to verify that the data stored at the data block has errors within an acceptable limit. During the data integrity check, one or more reliability statistics are determined for data stored at the data block. One example of a reliability statistic is raw bit error rate (RBER). The RBER corresponds to a number of bit errors per sample size (e.g., per page or per code word) that the data stored at the data block experiences.

Conventionally, if the reliability statistic for a data block exceeds a threshold value, indicating a high error rate associated with data stored at the data block due, at least in part, to read disturb, then the data stored at the data block is relocated to a new data block of the memory sub-system (also referred to herein as "folding"). The folding of the data stored at the data block to the other data block can include writing the data to the other data block to refresh the data stored by the memory sub-system. This can be done to negate the effects of read disturb associated with the data and to erase the data at the data block. As previously discussed, however, the effects of read disturb are worse on wordlines that are adjacent to the wordline on which a read operation is performed than on other wordlines located further away. Therefore, read disturb can induce a non-uniform stress on memory cells of the data block if memory cells on a particular wordline are read from more frequently. For example, memory cells of a data block that are adjacent to a wordline on which memory cells are frequently read from can have a high error rate, while memory cells that are not adjacent to that wordline can have a lower error rate due to a reduced impact by read disturb on these memory cells.

Depending on the data access activity of the host system for a particular memory sub-system, the effects of read disturb can be either focused on one or more particular memory pages in a block or distributed more evenly across all the memory pages of the block. If read stress is focused on a single memory page, for example, the block can be considered to be experiencing single word line (SWL) read disturb (also referred to as "row hammer" read disturb). Single word line read disturb can occur in situations where a certain piece of data stored in the memory sub-system is read significantly more often than the rest of the data in the same block. If the read stress is uniformly distributed across multiple memory pages, however, the block can be considered to be experiencing uniform read disturb (also referred to as "full block" read disturb). Uniform read disturb can occur in situations where each piece of data in a block is read with approximately the same frequency (e.g., for a block storing data of a video file, where playback of the video file will trigger a read of each page of that block).

A conventional memory sub-system performs a data integrity check at the block level using a scan operation. Since scan operations are performed at the block level, the memory sub-system monitors the number of read operations performed on a particular data block and performs a scan operation when the read count (i.e., the number of read operations) meets or exceeds a certain read threshold. Depending on the implementation, the memory sub-system can maintain a read counter or multiple read counters that track the number of read operations performed on segments of the memory device. For example, some systems may maintain a separate read counter for each physical block, while other systems may maintain a read counter for a super block (i.e., a collection of multiple physical blocks). In many cases, the available memory space (e.g., RAM) is insufficient to support the use of read counters for each individual wordline of a memory block. The memory sub-system controller firmware generally cannot distinguish between SWL read disturb stress and uniform read disturb stress, so it utilizes a conservative read threshold set based on SWL read disturb stress. Even then, since the count of read operations is maintained at the block level, the memory sub-system controller has no way to tell which wordlines of the data block are or may be experiencing the SWL read disturb and, thus, performs the scan operation on every wordline of the data block. This is often unnecessary since the data block may simply be experiencing uniform read disturb stress, and even if SWL read disturb stress is present, it is likely that only a small percentage of wordlines in the data block are affected. Thus, performing scans in this manner can result in the performance of excessive memory management operations by the memory sub-system. This can result in a decrease of performance of the memory sub-system, as well as an increase of the power consumption of the memory sub-system. System bandwidth and other resources are also tied up for extended periods of time, preventing the use of those resources for other functionality.

Aspects of the present disclosure address the above and other deficiencies by performing selective read disturb sampling. When a data integrity scan is triggered for a data block, a block scan component selectively identifies a first set of wordlines of the data block to scan. Rather than scanning all of the wordlines of the data block, the block scan component can scan approximately 50% of the wordlines. The wordlines selected for inclusion in the first set can include alternating pairs of adjacent wordlines (e.g., every other pair of two adjacent wordlines). For example, block scan component can select a first pair of adjacent wordlines, omit a second pair of adjacent wordlines, select a third pair of adjacent wordlines, etc., where the first pair of adjacent wordlines and the third pair of adjacent wordlines are physically separated by the second pair of adjacent wordlines. As part of the data integrity scan, the block scan component can determine error rates or some other reliability statistic for the wordlines included in the first set, and use that data to make a determination of whether the data block will be refreshed.

In a situation where the data block experiences SWL read disturb, generally the two wordlines immediately adjacent to the wordline to which the repeated read operations are directed (i.e., the selected wordline) experience higher levels of stress. Since these two wordlines are separated by the selected wordline, when the block scan component selects alternating pairs of adjacent wordlines for inclusion in the set of wordlines, at least one of the two wordlines will be scanned. Since the stress level on each of the two wordlines adjacent to the selected wordline is approximately equal, either wordline can be representative of the worst stress level. Thus, if the block scan component determines that the stress level warrants a refresh of the data block, the data can be relocated before irreversible damage is done to the data block. If a block refresh is not needed, in response to a subsequent trigger, the block scan component can perform another data integrity scan on a second set of wordlines including those wordlines not scanned during the first data integrity scan. Thus, the sets of wordlines evaluated during each successive data integrity scan can alternate.

By selecting a specific set of wordlines of the data block to scan, the sample size for a given data integrity scan can be reduced by approximately 50%. This smaller sample size reduces the time utilized to perform each data integrity scan thereby increasing performance, decreasing power consumption and freeing system resources for other functionality. Thus, the memory sub-system controller will be occupied for less time when performing data integrity scans, thereby allowing more time for the controller to handle other data access operations for the memory sub-system (e.g., host access operations). These benefits may be amplified when higher density memory is used (e.g., QLC memory which has a smaller read disturb capability) or as the size of data blocks, and correspondingly the number of wordlines contained therein, increases.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

In one embodiment, the memory sub-system 110 includes a block scan component 113 that can be used to perform selective read disturb sampling during a scan or other data integrity check on the data blocks of memory devices 130 and 140. In one embodiment, block scan component 113 maintains one or more counters to track a number of read operations performed on each block of memory device 130, for example. In response to determining that the number of read operations performed on the data block satisfies a first threshold criterion, block scan component can perform a first data integrity scan to determine one or more first error rates for the data block, each of the one or more first error rates corresponding to a first set of wordlines of the data block. In one embodiment, the first set of wordlines includes alternating pairs of adjacent wordlines (i.e., every other pair of two adjacent wordlines) of the data block. If at least one of the one or more first error rates satisfies a first error threshold criterion, block scan component 113 can relocate the data stored in the data block to another data block on memory device 130 and reset the read counter for the original data block.

If at least one of the first one or more error rates does not satisfy the first error threshold criterion, block scan component 113 can determine whether the number of read operations performed on the data block satisfies a second threshold criterion. Responsive to the number of read operations performed on the data block satisfying the second threshold criterion, block scan component 113 can perform a second data integrity scan to determine one or more second error rates for the data block, each of the second one or more error rates corresponding to a second set of wordlines of the data block. In one embodiment, the second set of wordlines includes second alternating pairs of adjacent wordlines (i.e., those pairs of adjacent wordlines not included in the first set used for the first data integrity scan). If at least one of the one or more second error rates satisfies the first error threshold criterion, block scan component 113 can relocate the data stored in the data block to another data block on memory device 130 and reset the read counter for the original data block.

In one embodiment, a certain data block includes a first pair of adjacent wordlines, a second pair of adjacent wordlines, a third pair of adjacent wordlines, and a fourth pair of adjacent wordlines. The first pair of adjacent wordlines and the third pair of adjacent wordlines can be physically separated by the second pair of adjacent wordlines, and the second pair of adjacent wordlines and the fourth pair of adjacent wordlines can be physically separated by the third pair of adjacent wordlines. For example, the first set of wordlines used in the first data integrity scan can include the first pair of adjacent wordlines and the third pair of adjacent wordlines, and the second set of wordlines used in the second data integrity scan can include the second pair of adjacent wordlines and the fourth pair of adjacent wordlines.

In one embodiment, in addition to the first threshold criterion that, if met or exceeded, can trigger a refresh of the relevant data block, block scan component 113 can further track a second threshold criterion that is less than the first threshold criterion. If in the first data integrity scan, for example, block scan component 113 determines that an error rate of at least one wordline of the first pair of adjacent wordlines satisfies a second error threshold criterion, and that an error rate of at least one wordline of the third pair of adjacent wordlines satisfies the second error threshold criterion, block scan component 113 can perform a supplemental data integrity scan to determine one or more error rates corresponding to the second pair of adjacent wordlines to determine if a refresh of the data block is appropriate. Similarly, if in the second data integrity scan, block scan component 113 determines that an error rate of at least one wordline of the second pair of adjacent wordlines satisfies the second error threshold criterion, and that an error rate of at least one wordline of the fourth pair of adjacent wordlines satisfies the second error threshold criterion, block scan component 113 can perform a supplemental data integrity scan to determine one or more error rates corresponding to the third pair of adjacent wordlines to determine if a refresh of the data block is appropriate. This ensures that if SWL read disturb stress is split among two or more wordlines of the data block, a recognized footprint of intermediate stress (i.e., stress that satisfies the lower second error threshold criterion but that does not satisfy the higher first error threshold criterion) among the set of wordlines examined during a given data integrity scan can indicate the potential presence of higher stress on an unscanned wordline that could potentially trigger a refresh of the data block. Accordingly, block scan component 113 can scan those suspect wordlines indicated by the recognized footprint, rather than scanning every unscanned wordline of the data block. Further details with regards to the operations of the block scan component 113 are described below.

Figure 2:
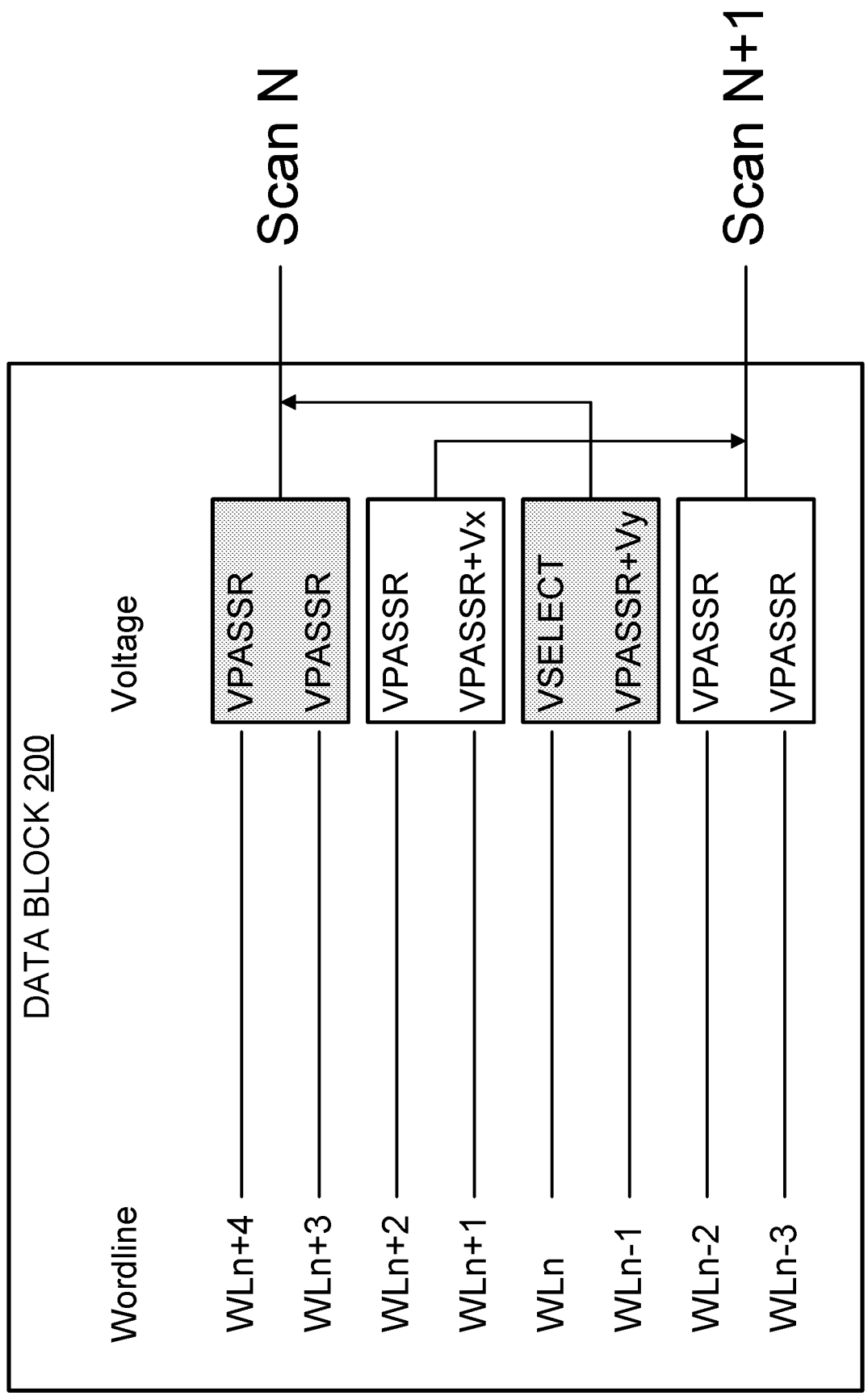
FIG. 2 is a block diagram illustrating selective read disturb sampling in a data block of a memory device in a memory sub-system in accordance with some embodiments of the present disclosure.

FIG. 2 is a block diagram illustrating selective read disturb sampling in a data block 200 of a memory device in a memory sub-system in accordance with some embodiments of the present disclosure. In one embodiment, data block 200 is representative of any of the data blocks that make up memory device 130 or memory device 140. As illustrated, data block 200 includes a number of separate wordlines, such as wordlines WLn+4, WLn+3, WLn+2, WLn+1, WLn, WLn−1, WLn−2, and WLn−2. This number and arrangement of wordlines is merely one example, and in other embodiments, data block 200 may include any other number of wordlines (such as tens of wordlines or hundreds of wordlines). During a memory access operation, such as a read operation, different wordlines of data block 200 can experience different voltage levels. For example, when data from a memory cell arranged on a certain wordline (e.g., WLn) is being read, a corresponding read voltage (e.g. VSELECT) is applied to that wordline. A pass voltage (e.g., VPASSR) can be applied to other wordlines of data block 200 that are not being read. In one embodiment, however, the two wordlines (e.g., WLn+1 and WLn−1) that are adjacent to the wordline being read (e.g., WLn) are known to experience some capacitive coupling as a result of the read operation, which can impact the voltage levels on those two adjacent wordlines. Accordingly, a higher pass voltage can be applied to those two wordlines to account for the coupling and to ensure that those wordlines are not activated during the read operation on wordline WLn. As a result, in one embodiment, the pass voltage VPASSR is applied to wordlines WLn+4, WLn+3, WLn+2, WLn−2, and WLn−2, the higher pass voltages VPASSR+Vx and VPASSR+Vy are applied wordlines WLn+1 and WLn−1, respectively, and the read voltage VSELECT is applied to wordline WLn. If these voltages are repeatedly applied in this manner, the two wordlines WLn+1 and WLn−1 will experience higher stress due to the repeated application of the higher pass voltages VPASSR+Vx and VPASSR+Vy.

Accordingly, in one embodiment, block scan component 113 can perform selective read disturb sampling in data block 200. For example, block scan component 113 can maintain a counter to track a number of read operations performed on data block 200 and can determine whether the number of read operations satisfies a first threshold criterion (e.g., meets or exceeds a certain threshold). In one embodiment, the counter is maintained at the block level and is incremented each time a read operations is performed on any of the wordlines of data block 200. In response to the number of read operations (i.e., the value of the counter) satisfying the first threshold criterion, block scan component 113 can perform a first data integrity scan to determine one or more error rates for the data block. In one embodiment, block scan component 113 selects a first set of wordlines to be included in the first data integrity scan (e.g., Scan N), where the first set includes alternating pairs of adjacent wordlines (e.g., every other pair of adjacent wordlines). For example, in one embodiment, the first set of wordlines includes a first pair of adjacent wordlines (i.e., WLn+4 and WLn+3), omits a second pair of adjacent wordlines (i.e., WLn+2 and WLn+1), includes a third pair of adjacent wordlines (i.e., WLn and WLn−1) and omits a fourth pair of adjacent wordlines (i.e., WLn−2 and WLn−3).

As described above, WLn+1 and WLn−1 will generally experience higher levels of stress due to the higher pass voltages VPASSR+Vx and VPASSR+Vy being applied. Since these two wordlines are separated by the selected wordline WLn, however, at least one of the two wordlines will be included in the first set. For example, in the illustrated embodiment, WLn−1 is included in the first set, while WLN+1 is not included. If block scan component 113 determines that the stress level on WLn−1 warrants a refresh of the data block 200, the data can be relocated before irreversible damage is done to the data block. If a block refresh is not needed, in response to a subsequent trigger, block scan component 113 can perform another data integrity scan (e.g., Scan N+1) on a second set of wordlines including those wordlines not scanned during the first data integrity scan. For example, in one embodiment, the second set of wordlines omits the first pair of adjacent wordlines (i.e., WLn+4 and WLn+3), includes the second pair of adjacent wordlines (i.e., WLn+2 and WLn+1), omits the third pair of adjacent wordlines (i.e., WLn and WLn−1) and includes the fourth pair of adjacent wordlines (i.e., WLn−2 and WLn−3). Thus, in this embodiment, WLn+1 is included in the second set, while WLN−1 is not included. Since the stress level on each of the two wordlines WLn+1 and WLn−1 is approximately equal, either wordline can be representative of the worst stress level in data block 200, and only one of the two wordlines need be included in any one data integrity scan.

Figure 3:
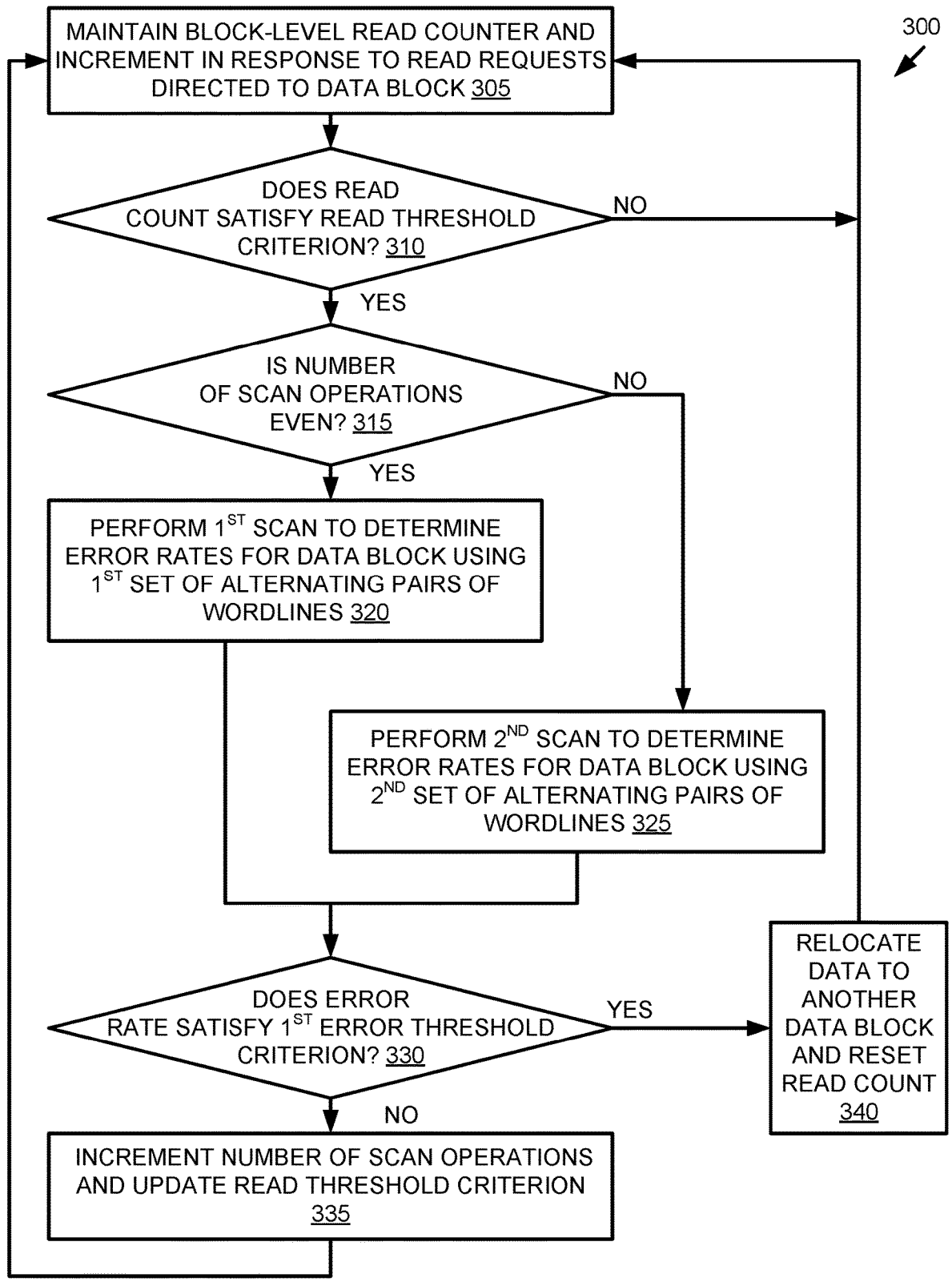
FIG. 3 is a flow diagram of an example method of selective read disturb sampling in a data block of a memory device in accordance with some embodiments of the present disclosure.

FIG. 3 is a flow diagram of an example method of selective read disturb sampling in a data block of a memory device in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by block scan component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing logic maintains a counter to track a number of read operations performed on a data block 200 of a memory device 130. In one embodiment, the counter is maintained at the block level and is incremented each time a read operations is performed on any of the wordlines of data block 200. In one embodiment, the counter is initialized at an initial value (e.g., 0) and is incremented in response to the read operations. In another embodiment, the initial value is some other number and the value of the counter can be decremented in response to the read operations.

At operation 310, the processing logic determines whether the number of read operations performed on data block 200 (e.g., the value of the counter) satisfies a read threshold criterion. In one embodiment, the read threshold criterion is satisfied when the number of read operations meets or exceeds some defined threshold value. For example, the threshold value may be set based on testing or other diagnostics at a level when a data integrity scan is appropriate to determine an error level or other reliability metric of the data block 200. In one embodiment, block scan component 113 compares the value of the counter to the threshold value to determine whether the read threshold criterion is satisfied. If the read count does not meet or exceed the defined threshold value, the processing logic returns to operation 305 and continues monitoring the read count values of the data block.

In response to determining that the number of read operations performed on the data block satisfies the read threshold criterion, at operation 315, the processing logic determines whether a number of scan operations that have been performed is even or odd. In one embodiment, block scan component maintains a separate counter which is incremented each time a scan operation is performed. The number of scan operations that have been performed, or alternatively, a next scan operation to be performed, can influence which wordlines are included in a set of wordlines for the next scan operation. For example, a scan threshold criterion can be satisfied if the number of scan operations that have been performed is even. Conversely, the scan threshold criterion is not satisfied if the number of scan operations that have been performed is odd. In one embodiment, if the number of scan operations that have been performed is even, the processing logic continues to operation 320, and if the number of scan operations that have been performed is not even (i.e., is odd), the processing logic continues to operation 325.

At operation 320, the processing logic can perform a first data integrity scan to determine one or more first error rates for the data block 200, each of the one or more first error rates corresponding to a first set of wordlines of the data block. In one embodiment, the first set of wordlines includes alternating pairs of adjacent wordlines (i.e., every other pair of two adjacent wordlines) of the data block 200. For example, in one embodiment, the first set of wordlines includes a first pair of adjacent wordlines (i.e., WLn+4 and WLn+3), omits a second pair of adjacent wordlines (i.e., WLn+2 and WLn+1), includes a third pair of adjacent wordlines (i.e., WLn and WLn−1) and omits a fourth pair of adjacent wordlines (i.e., WLn−2 and WLn−3). During the scan, block scan component 113 identifies one or more reliability statistics, such as the raw bit error rate (RBER) representing a number of bit errors per unit of time that the data stored at the block experiences. In one embodiment, during the scan, scan determining component 113 reads a raw code word (i.e., a series of a fixed number of bits) from the selected wordlines of the data block 200. Block scan component 113 can apply the code word to an error correcting code (ECC) decoder to generate a decoded code word and compare the decoded code word to the raw code word. Block scan component 113 can count a number of flipped bits between the decoded code word and the raw code word, with a ratio of the number of flipped bits to the total number of bits in the code word representing the RBER. Block scan component 113 can repeat this process for additional code words on the other selected wordlines until the entire set of wordlines has been scanned.

At operation 325, the processing logic can perform a second data integrity scan to determine one or more second error rates for the data block 200, each of the one or more second error rates corresponding to a second set of wordlines of the data block. In one embodiment, the second set of wordlines includes alternating pairs of adjacent wordlines (i.e., every other pair of two adjacent wordlines) that were not included in the first set of wordlines. For example, in one embodiment, the second set of wordlines omits the first pair of adjacent wordlines (i.e., WLn+4 and WLn+3), includes the second pair of adjacent wordlines (i.e., WLn+2 and WLn+1), omits the third pair of adjacent wordlines (i.e., WLn and WLn−1) and includes the fourth pair of adjacent wordlines (i.e., WLn−2 and WLn−3). Depending on the embodiment, the second data integrity scan need not be performed subsequent to the first data integrity scan, and can instead be performed before the first data integrity scan.

At operation 330, the processing logic determines whether the error rate for the block satisfies an error threshold criterion (i.e., meets or exceeds an error threshold). In one embodiment, block scan component 113 compares the error rate to the error threshold which represents an error correction capability of the memory device. If the error rate does not meet or exceed the error threshold, the processing device proceeds to operation 335.

At operation 335, the processing logic increments the counter tracking the number of scan operations that have been performed and updates the read threshold criterion. For example, since error rate did not meet or exceed the error threshold, and the data block was not refreshed, block scan component 113 can reduce the read threshold criterion, such that a subsequent scan operation can be performed after a fewer number of read operations than occurred before the previous scan operation was performed. Furthermore, processing returns to operation 305, where the processing logic continues monitoring the read count values of the blocks on the memory component and incrementing the counter in response to new read operations.

If the error threshold criterion is satisfied, at operation 340, the processing logic relocates the data from the data block 200 to another block and resets the read count value of the read counter (e.g., to zero or to some other initial value). In one embodiment, block scan component 113 reads data stored in data block 200 (i.e., the block for which the error rate meets or exceeds the error threshold) and writes that data to another block. Once the data has been written to the other block, the data stored in the initial data block 200 is erased and the initial block is available to be programmed with new data. Depending on the embodiment, the data is relocated to another block of the same plane of the same memory device, to another plane on the same memory device, or to a different memory device of the memory sub-system 110. In addition, block scan component 113 also increments the counter tracking the number of scan operations that have been performed.

Figure 4A:
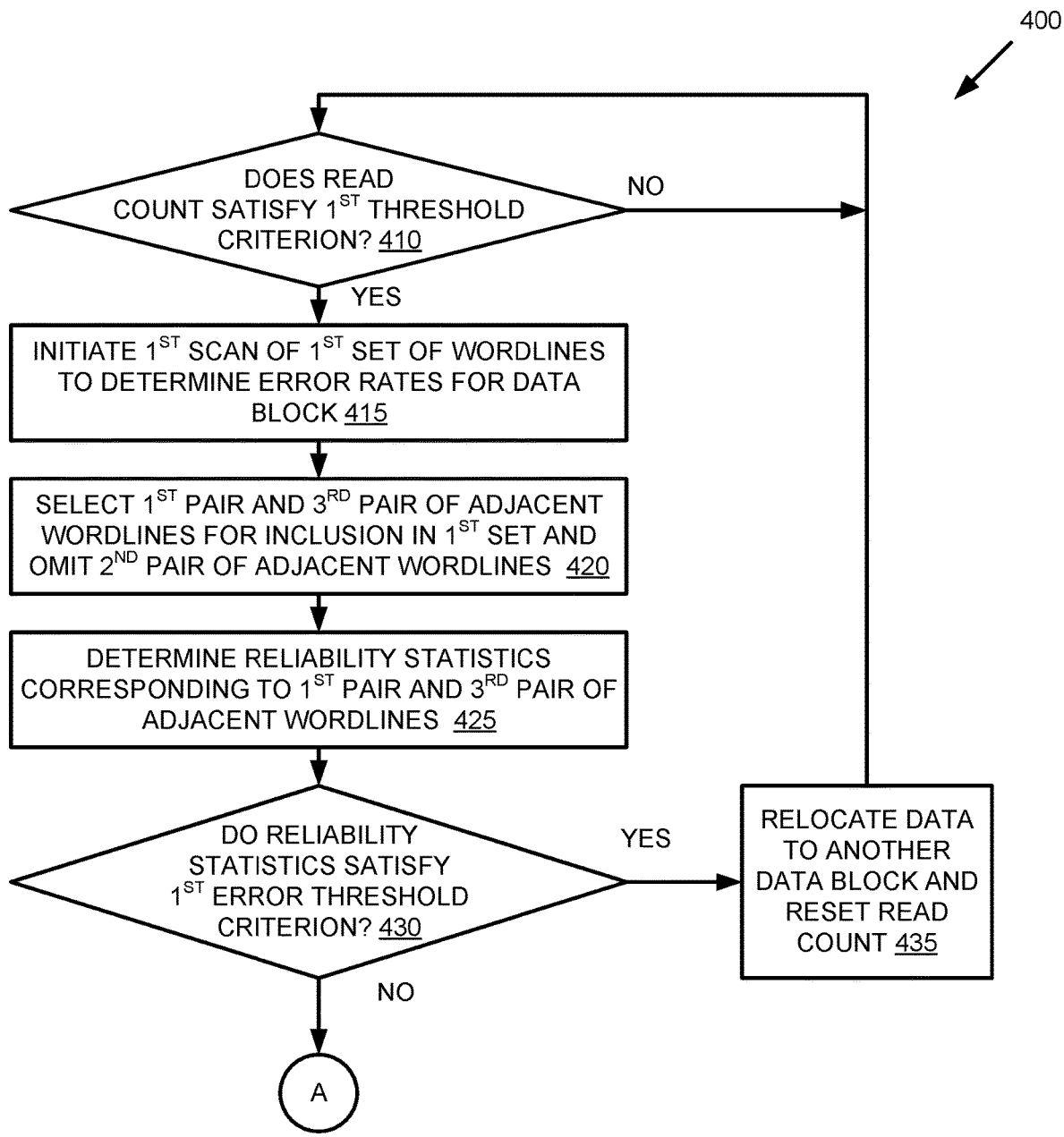
FIGS. 4A-4B are a flow diagram of an example method of selecting different sets of wordlines during subsequent read disturb scan operations performed on a data block of a memory device in accordance with some embodiments of the present disclosure.
Figure 4B:
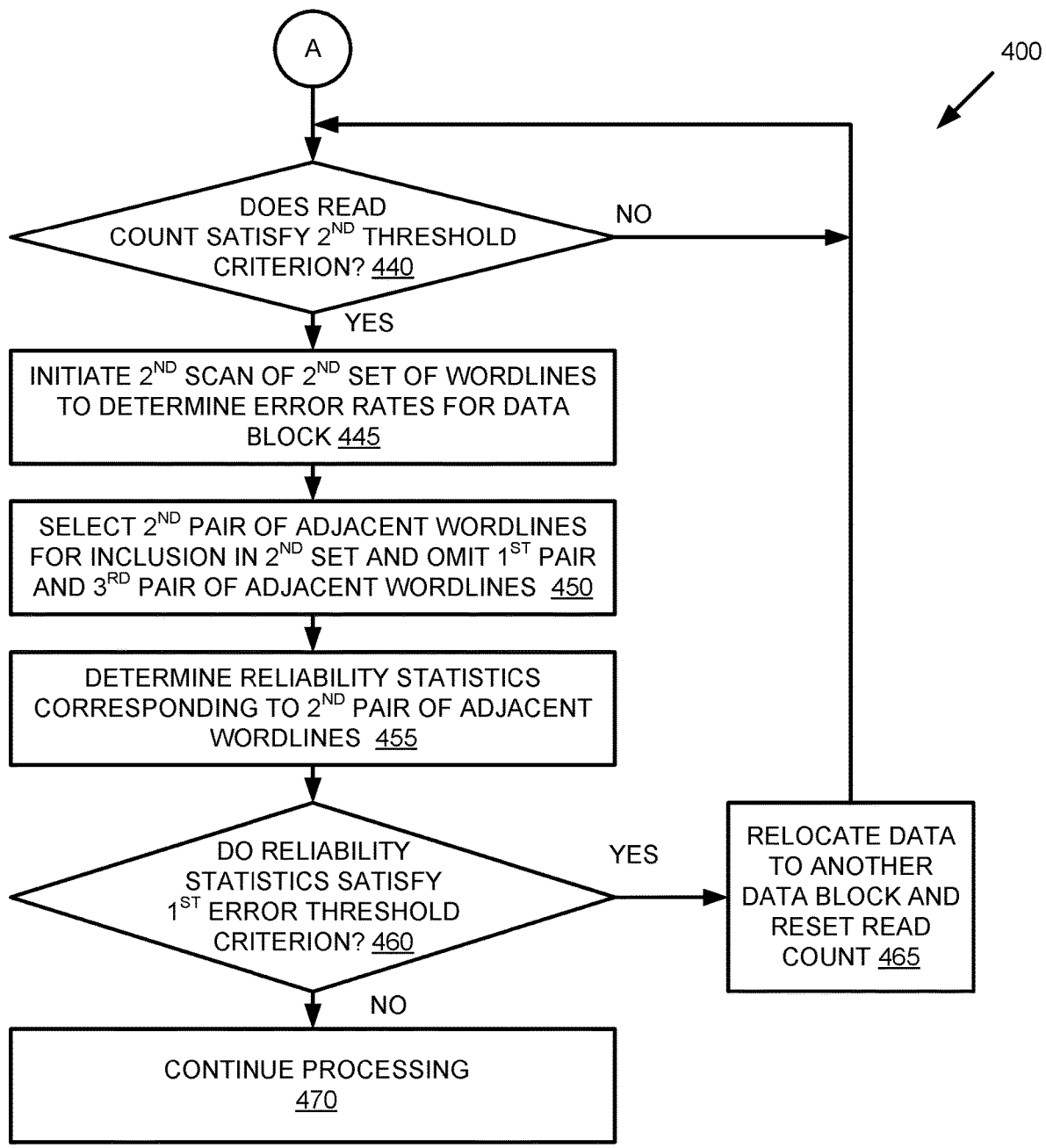

FIGS. 4A-4B are a flow diagram of an example method of selecting different sets of wordlines during subsequent read disturb scan operations performed on a data block of a memory device in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by block scan component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic determines whether a first read count of the data block 200 satisfies a read threshold criterion, the first read count indicating a number of read operations performed on the data block 200. In response to determining that the first read count of the data block does not satisfy the read threshold criterion, the processing logic returns to operation 410 and continues monitoring the read count of the data block 200.

In response to determining that the first read count of the data block 200 satisfies the read threshold criterion, at operation, 415, the processing logic initiates a first data integrity scan of a first set of a plurality of wordlines of the data block 200. At operation 420, the processing logic selects a first pair of adjacent wordlines (e.g., WLn+4 and WLn+3) and a third pair of adjacent wordlines (e.g., WLn and WLn−1) for inclusion in the first set while omitting a second pair of adjacent wordlines (e.g., WLn+2 and WLn+1), wherein the first pair of adjacent wordlines and the third pair of adjacent wordlines are physically separated by the second pair of adjacent wordlines in the data block 200. At operation 425, the processing logic determines one or more reliability statistics (e.g., error rate) corresponding to the first pair of adjacent wordlines and the third pair of adjacent wordlines as part of the first data integrity scan of the first set of the plurality of wordlines.

At operation 430, the processing logic determines whether at least one of the one or more reliability statistics for the block satisfies an error threshold criterion (i.e., meets or exceeds an error threshold). In one embodiment, block scan component 113 compares the determined reliability statistic for each wordline to the error threshold which represents an error correction capability of the memory device. If the error rate does not meet or exceed the error threshold, the processing device proceeds to operation 440, as illustrated in FIG. 4B (see block "A").

If the error threshold criterion is satisfied, at operation 435, the processing logic relocates the data from the data block 200 to another block and resets the read count value of the read counter (e.g., to zero or to some other initial value). In one embodiment, block scan component 113 reads data stored in data block 200 (i.e., the block for which the reliability statistics meet or exceed the error threshold) and writes that data to another block. Once the data has been written to the other block, the data stored in the initial data block 200 is erased and the initial block is available to be programmed with new data.

Referring to FIG. 4B, at operation 440, the processing logic determines whether the read count of the data block 200 satisfies a second read threshold criterion. In response to determining that the read count of the data block does not satisfy the second read threshold criterion, the processing logic returns to operation 440 and continues monitoring the read count of the data block 200.

In response to determining that the read count of the data block 200 satisfies the second read threshold criterion, at operation, 445, the processing logic initiates a second data integrity scan of a second set of a plurality of wordlines of the data block 200. At operation 450, the processing logic selects second pair of adjacent wordlines (e.g., WLn+2 and WLn+1) for inclusion in the second set while omitting the first pair of adjacent wordlines (e.g., WLn+4 and WLn+3) and the third pair of adjacent wordlines (e.g., WLn and WLn−1). At operation 455, the processing logic determines one or more reliability statistics (e.g., error rate) corresponding to the second pair of adjacent wordlines as part of the second data integrity scan of the second set of the plurality of wordlines.

At operation 460, the processing logic determines whether at least one of the one or more reliability statistics for the block satisfies an error threshold criterion (i.e., meets or exceeds an error threshold). In one embodiment, block scan component 113 compares the determined reliability statistic for each wordline to the error threshold which represents an error correction capability of the memory device. If the error rate does not meet or exceed the error threshold, the processing device proceeds to operation 470, and continues processing.

If the error threshold criterion is satisfied, at operation 465, the processing logic relocates the data from the data block 200 to another block and resets the read count value of the read counter (e.g., to zero or to some other initial value). In one embodiment, block scan component 113 reads data stored in data block 200 (i.e., the block for which the reliability statistics meet or exceed the error threshold) and writes that data to another block. Once the data has been written to the other block, the data stored in the initial data block 200 is erased and the initial block is available to be programmed with new data.

Figure 5:
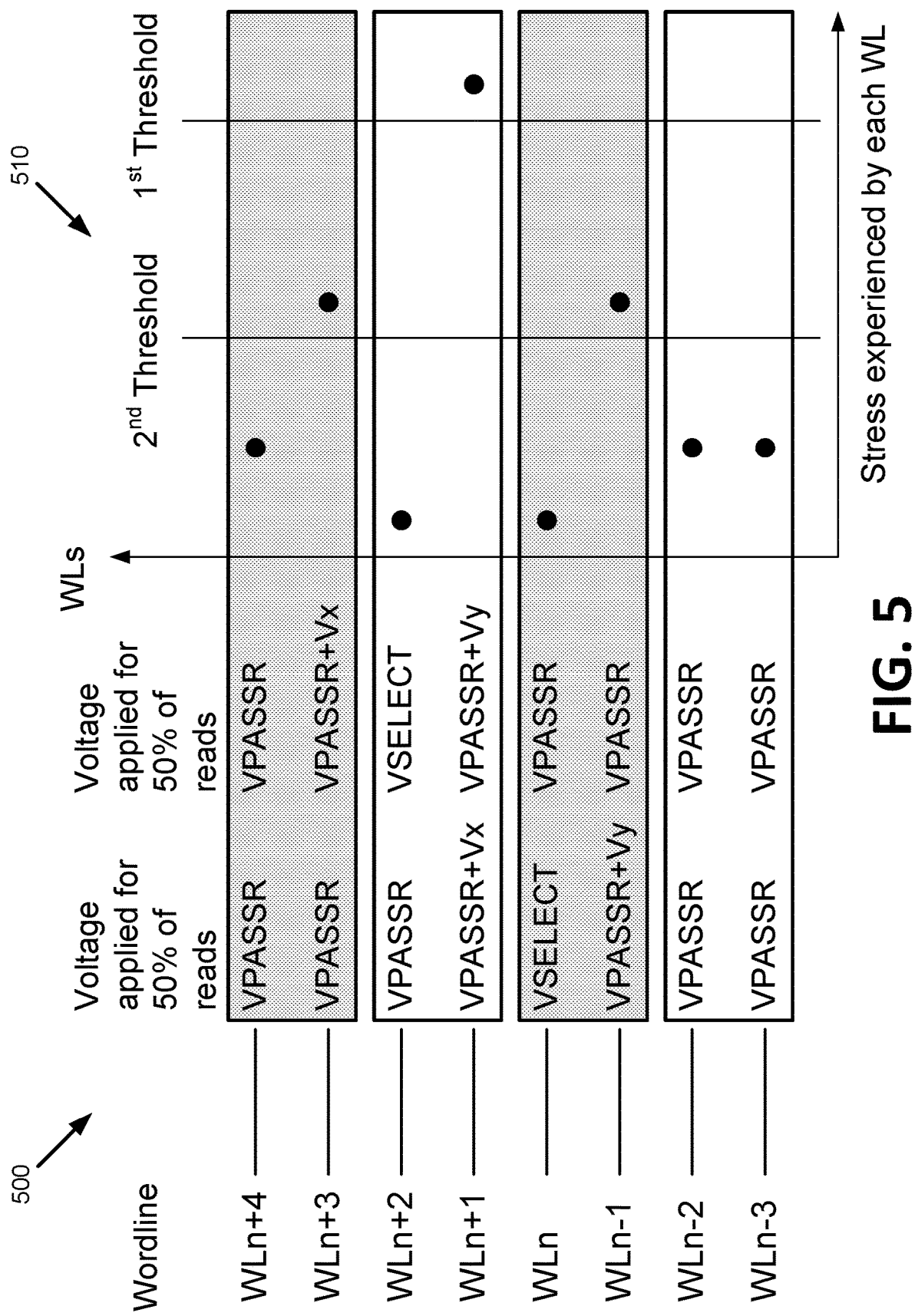
FIG. 5 is a block diagram illustrating a stress pattern identified from selective read disturb sampling that warrants a supplemental read disturb scan of certain wordlines of a data block of a memory device in a memory sub-system in accordance with some embodiments of the present disclosure.

FIG. 5 is a block diagram illustrating a stress pattern identified from selective read disturb sampling that warrants a supplemental read disturb scan of certain wordlines of a data block of a memory device in a memory sub-system in accordance with some embodiments of the present disclosure. In one embodiment, data block 500 is representative of data block 200 or any of the other data blocks that make up memory device 130 or memory device 140. As illustrated, data block 500 includes a number of separate wordlines, such as wordlines WLn+4, WLn+3, WLn+2, WLn+1, WLn, WLn−1, WLn−2, and WLn−3. This number and arrangement of wordlines is merely one example, and in other embodiments, data block 500 may include any other number of wordlines (such as tens of wordlines or hundreds of wordlines). During a memory access operation, such as a read operation, different wordlines of data block 200 can experience different voltage levels. In one embodiment, there may be a certain pattern of read operations performed on data block 500. For example, a certain percentage of read operations, such as approximately 50% or some other percentage, can be directed to WLn. As a result, in one embodiment, the pass voltage VPASSR is applied to wordlines WLn+4, WLn+3, WLn+2, WLn−2, and WLn−2, the higher pass voltages VPASSR+Vx and VPASSR+Vy are applied wordlines WLn+1 and WLn−1, respectively, and the read voltage VSELECT is applied to wordline WLn, for approximately 50% of the read operations Furthermore, another percentage of read operations, such as approximately 50% or some other percentage can be directed to WLn+2. As a result, in one embodiment, the pass voltage VPASSR is applied to wordlines WLn+4, WLn, WLn−1, WLn−2, and WLn−2, the higher pass voltages VPASSR+Vx and VPASSR+Vy are applied wordlines WLn+3 and WLn+1, respectively, and the read voltage VSELECT is applied to wordline WLn+2, for approximately 50% of the read operations.

Accordingly, in one embodiment, block scan component 113 can perform selective read disturb sampling in data block 500, as described above. For example, block scan component 113 can maintain a counter to track a number of read operations performed on data block 500 and can determine whether the number of read operations satisfies a first threshold criterion (e.g., meets or exceeds a certain threshold). In one embodiment, the counter is maintained at the block level and is incremented each time a read operations is performed on any of the wordlines of data block 500. In response to the number of read operations (i.e., the value of the counter) satisfying the first threshold criterion, block scan component 113 can perform a first data integrity scan to determine one or more error rates for the data block. In one embodiment, block scan component 113 selects a first set of wordlines to be included in the first data integrity scan (e.g., Scan N), where the first set includes alternating pairs of adjacent wordlines (e.g., every other pair of adjacent wordlines). For example, in one embodiment, the first set of wordlines includes a first pair of adjacent wordlines (i.e., WLn+4 and WLn+3), omits a second pair of adjacent wordlines (i.e., WLn+2 and WLn+1), includes a third pair of adjacent wordlines (i.e., WLn and WLn−1) and omits a fourth pair of adjacent wordlines (i.e., WLn−2 and WLn−3).

As described above, WLn+3, WLn+1 and WLn−1 will generally experience higher levels of stress due to the higher pass voltages VPASSR+Vx and VPASSR+Vy being applied during corresponding read operations. In one embodiment, the stress experienced by each wordline is illustrated in graphical form 510 in FIG. 5. In one embodiment, WLn+3 and WLn−1 experience intermediate levels of stress since the higher pass voltages VPASSR+Vx and VPASSR+Vy are only applied to those wordlines for approximately 50% of the read operations, while WLn+1 experiences a higher level of stress since the higher pass voltages area applied to that wordline for approximately 100% of the read operations.

Since, WLn+3 and WLn−1 are included in the first set of wordlines used in the first scan operation, and WLn+1 is omitted from the first set, the high stress level on WLn+1 may not be detected in the first scan operation. Accordingly, in one embodiment, in addition to the first threshold criterion that, if met or exceeded, can trigger a refresh of the relevant data block, block scan component 113 can further track a second threshold criterion that is less than the first threshold criterion. If in the first data integrity scan, for example, block scan component 113 determines that an error rate of at least one wordline (e.g., WLn+3) of the first pair of adjacent wordlines satisfies (e.g., meets or exceeds) the second error threshold criterion, and that an error rate of at least one wordline (e.g., WLn−1) of the third pair of adjacent wordlines satisfies the second error threshold criterion, block scan component 113 can perform a supplemental data integrity scan to determine one or more error rates corresponding to the second pair of adjacent wordlines (e.g., WLn+2 and WLn+1) to determine if a refresh of the data block is appropriate. This ensures that if SWL read disturb stress is split among two or more wordlines of the data block, a recognized footprint of intermediate stress (i.e., stress that satisfies the lower second error threshold criterion but that does not satisfy the higher first error threshold criterion) among the set of wordlines examined during a given data integrity scan can indicate the potential presence of higher stress on an unscanned wordline (i.e., WLn+1) that could potentially trigger a refresh of the data block. Accordingly, block scan component 113 can scan those suspect wordlines (i.e., WLn+2 and WLn+1) indicated by the recognized footprint, rather than scanning every unscanned wordline of the data block.

Figure 6:
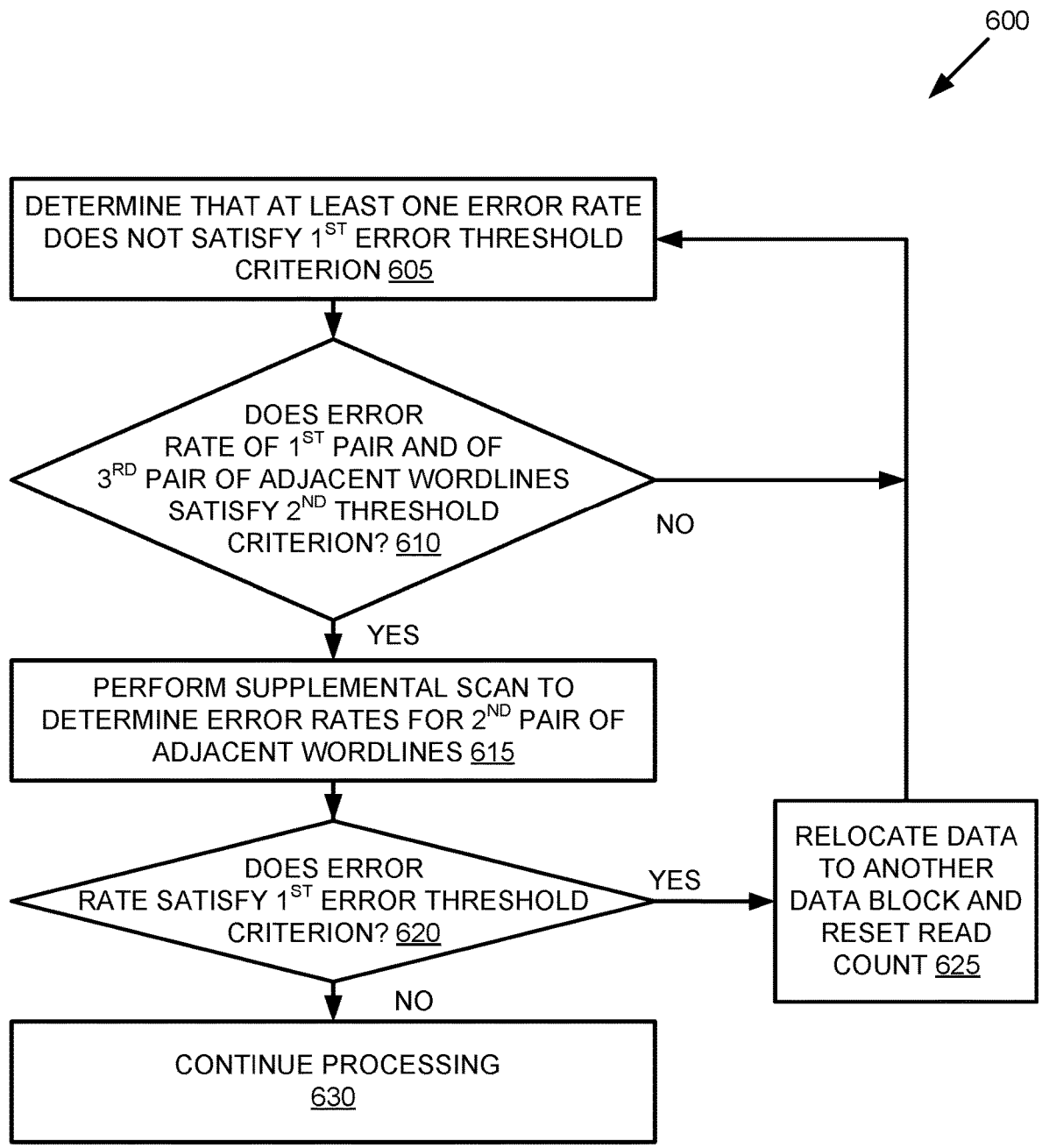
FIG. 6 is a flow diagram of an example method of identifying a stress pattern from selective read disturb sampling that warrants a supplemental read disturb scan of certain wordlines of a data block in a memory sub-system in accordance with some embodiments of the present disclosure.

FIG. 6 is a flow diagram of an example method of identifying a stress pattern from selective read disturb sampling that warrants a supplemental read disturb scan of certain wordlines of a data block in a memory sub-system in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by block scan component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 605, the processing logic determines that at least one error rate, or other reliability statistic, determined from a data integrity scan does not satisfy the first error threshold criterion associated with a refresh of data block 500. At operation 610, the processing logic determines whether the error rate of at least one wordline of the first pair of adjacent wordlines (e.g., WLn+4 and WLn+3) satisfies a second error threshold criterion, which is lower than the first threshold criterion, and that an error rate of at least one wordline of the third pair of adjacent wordlines (e.g., WLn and WLn−1) satisfies the second, lower, error threshold criterion. If not, the processing logic returns to operation 605. If so, however, at operation 615, the processing logic performs a supplemental data integrity scan to determine one or more error rates corresponding to the second pair of adjacent wordlines (e.g., WLn+2 and WLn+1) located physically between the first pair of adjacent wordlines and the second pair of adjacent wordlines in the data block 500.

At operation 620, the processing logic determines whether one or more error rates corresponding to the second pair of adjacent wordlines satisfies the first, higher, error threshold criterion. If so, at operation 625, the processing logic relocates the data from the data block 500 to another block and resets the read count value of the read counter (e.g., to zero or to some other initial value). If not, at operation 630, the processing logic continues processing.

Figure 7:
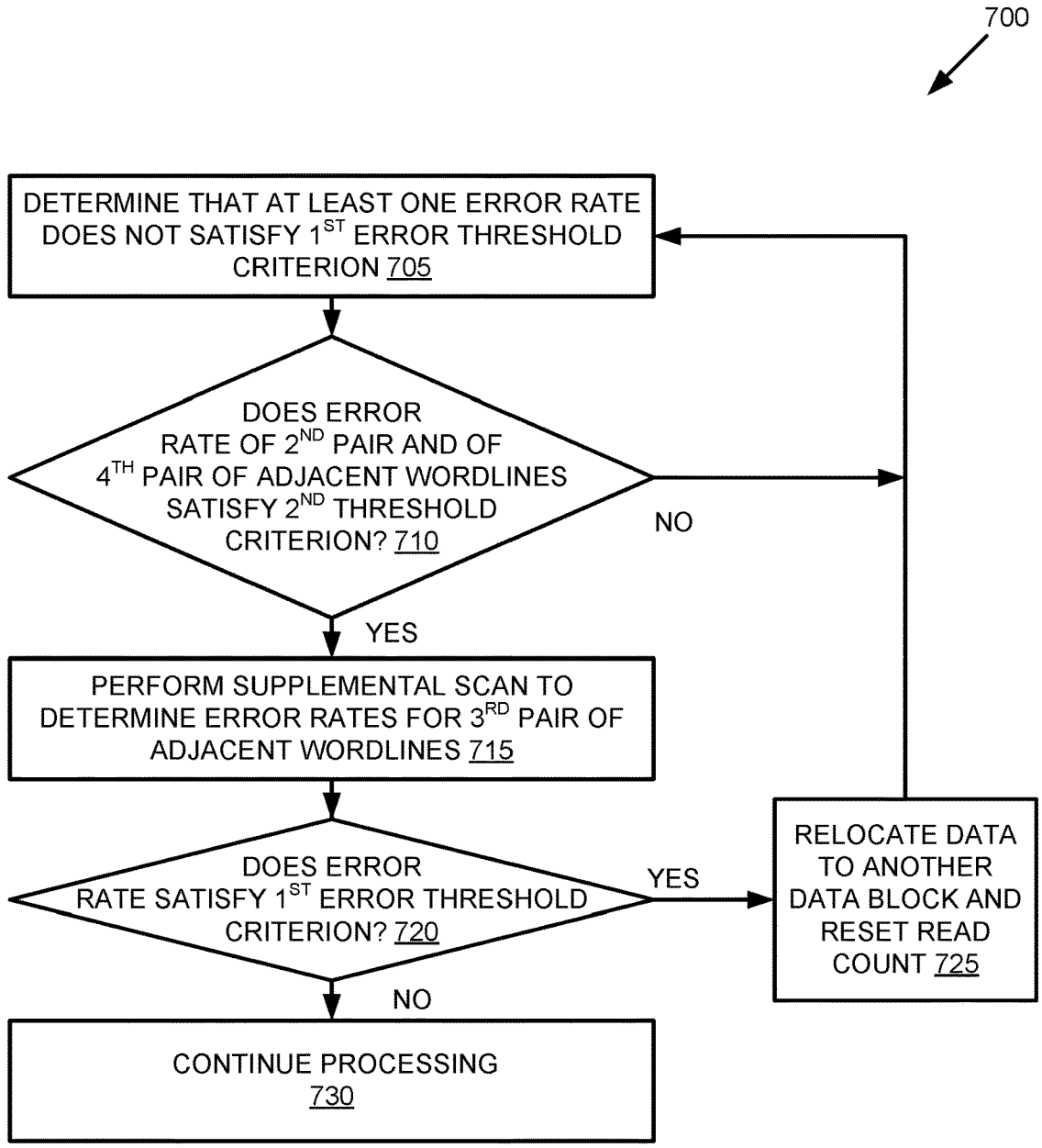
FIG. 7 is a flow diagram of an example method of identifying a stress pattern from selective read disturb sampling that warrants a supplemental read disturb scan of certain wordlines of a data block in a memory sub-system in accordance with some embodiments of the present disclosure.

FIG. 7 is a flow diagram of an example method of identifying a stress pattern from selective read disturb sampling that warrants a supplemental read disturb scan of certain wordlines of a data block in a memory sub-system in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by block scan component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 705, the processing logic determines that at least one error rate, or other reliability statistic, determined from a data integrity scan does not satisfy the first error threshold criterion associated with a refresh of data block 500. At operation 710, the processing logic determines whether the error rate of at least one wordline of the second pair of adjacent wordlines (e.g., WLn+2 and WLn+1) satisfies a second error threshold criterion, which is lower than the first threshold criterion, and that an error rate of at least one wordline of the fourth pair of adjacent wordlines (e.g., WLn−2 and WLn−3) satisfies the second, lower, error threshold criterion. If not, the processing logic returns to operation 705. If so, however, at operation 715, the processing logic performs a supplemental data integrity scan to determine one or more error rates corresponding to the third pair of adjacent wordlines (e.g., WLn and WLn−1) located physically between the second pair of adjacent wordlines and the fourth pair of adjacent wordlines in the data block 500.

At operation 720, the processing logic determines whether one or more error rates corresponding to the second pair of adjacent wordlines satisfies the first, higher, error threshold criterion. If so, at operation 725, the processing logic relocates the data from the data block 500 to another block and resets the read count value of the read counter (e.g., to zero or to some other initial value). If not, at operation 730, the processing logic continues processing.

Figure 8:
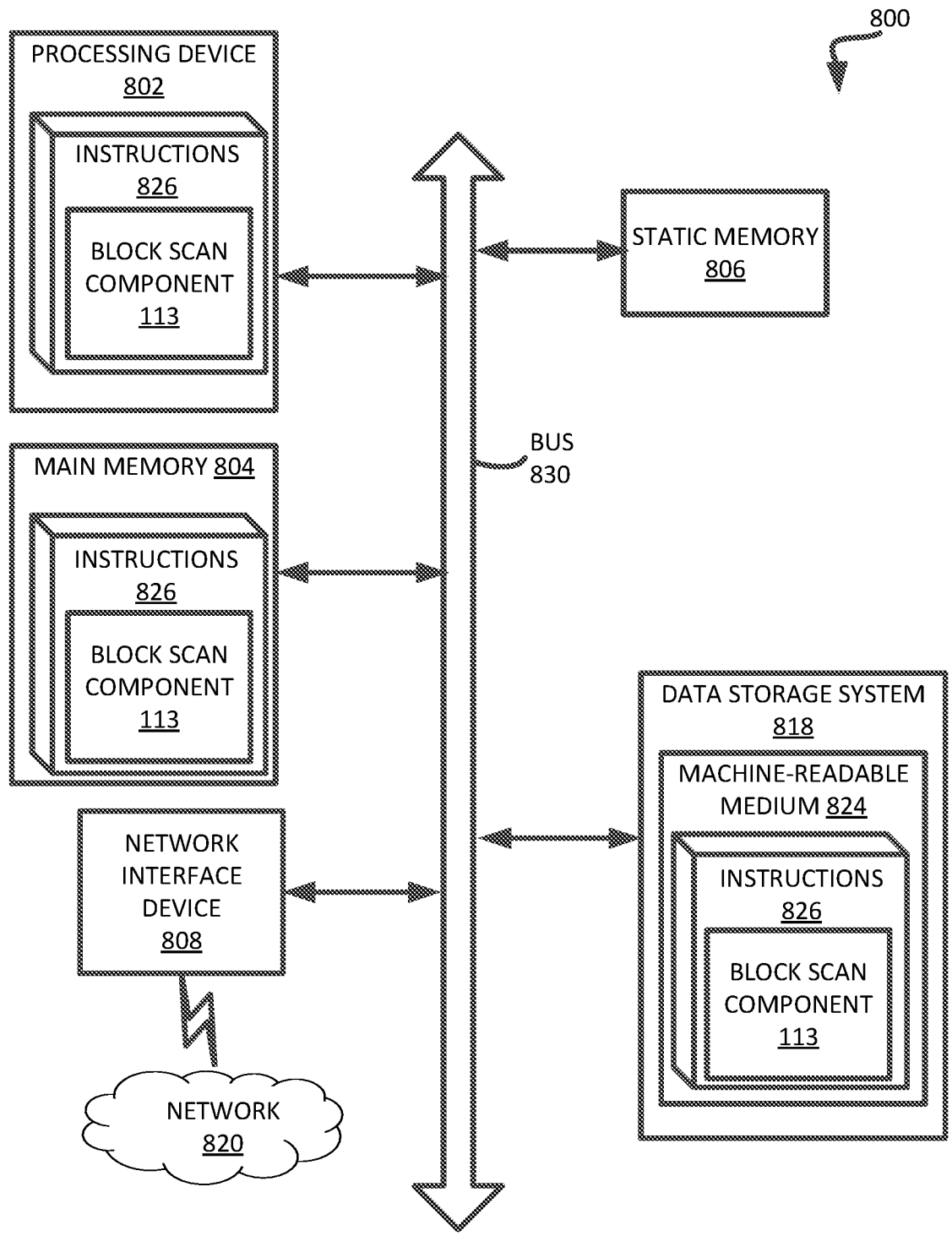
FIG. 8 is a block diagram of an example computer system in which embodiments of the present disclosure may operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block scan component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to the block scan component 113 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory device; and
    a processing device, operatively coupled with the memory device, to perform operations comprising:
        determining an occurrence of a triggering event for a segment of the memory device;
        determining a number of scan operations performed on the segment of the memory device; and
        based on the number of scan operations performed on the segment of the memory device, identifying a first set of wordlines of the segment and performing a first data integrity scan to determine one or more first error rates corresponding to the first set of wordlines of the segment, the first set of wordlines comprising first alternating pairs of adjacent wordlines, wherein the first set of wordlines is interleaved with but excludes a second set of wordlines.

2. The system of claim 1, wherein determining the occurrence of the triggering event for the segment of the memory device comprises:
    maintaining a counter to track a number of read operations performed on the segment of the memory device; and
    determining that the number of read operations performed on the segment satisfies a read threshold criterion.

3. The system of claim 1, wherein the processing device is to perform operations further comprising:
    determining whether at least one of the first one or more error rates satisfies a first error threshold criterion; and
    responsive to at least one of the first one or more error rates satisfying the first error threshold criterion, relocating data stored in the segment to another segment of the memory device.

4. The system of claim 3, wherein the segment comprises a first pair of adjacent wordlines, a second pair of adjacent wordlines, a third pair of adjacent wordlines, and a fourth pair of adjacent wordlines, the first set of wordlines comprising the first pair of adjacent wordlines and the third pair of adjacent wordlines, the second set of wordlines comprising the second pair of adjacent wordlines and the fourth pair of adjacent wordlines, wherein the first pair of adjacent wordlines and the third pair of adjacent wordlines are physically separated by the second pair of adjacent wordlines, and wherein the second pair of adjacent wordlines and the fourth pair of adjacent wordlines are physically separated by the third pair of adjacent wordlines.

5. The system of claim 4, wherein the processing device is to perform operations further comprising:
    determining that an error rate of at least one wordline of the first pair of adjacent wordlines satisfies a second error threshold criterion, and that an error rate of at least one wordline of the third pair of adjacent wordlines satisfies the second error threshold criterion, wherein the second error threshold criterion is less than the first error threshold criterion; and
    performing a supplemental data integrity scan to determine one or more error rates corresponding to the second pair of adjacent wordlines.

6. The system of claim 5, wherein the processing device is to perform operations further comprising:
    determining whether at least one of the one or more error rates corresponding to the second pair of adjacent wordlines satisfies the first error threshold criterion; and
    responsive to at least one of the one or more error rates corresponding to the second pair of adjacent wordlines satisfying the first error threshold criterion, relocating data stored in the segment to another segment on the memory device.

7. A method comprising:
    determining an occurrence of a triggering event for a segment of a memory device;
    determining a number of scan operations performed on the segment of the memory device; and based on the number of scan operations performed on the segment of the memory device, identifying a first set of wordlines of the segment and performing a first data integrity scan to determine one or more first error rates corresponding to the first set of wordlines of the segment, the first set of wordlines comprising first alternating pairs of adjacent wordlines, wherein the first set of wordlines is interleaved with but excludes a second set of wordlines.

8. The method of claim 7, wherein determining the occurrence of the triggering event for the segment of the memory device comprises:
maintaining a counter to track a number of read operations performed on the segment of the memory device; and
determining that the number of read operations performed on the segment satisfies a read threshold criterion.

9. The method of claim 7, further comprising:
determining whether at least one of the first one or more error rates satisfies a first error threshold criterion; and
responsive to at least one of the first one or more error rates satisfying the first error threshold criterion, relocating data stored in the segment to another segment of the memory device.

10. The method of claim 9, wherein the segment comprises a first pair of adjacent wordlines, a second pair of adjacent wordlines, a third pair of adjacent wordlines, and a fourth pair of adjacent wordlines, the first set of wordlines comprising the first pair of adjacent wordlines and the third pair of adjacent wordlines, the second set of wordlines comprising the second pair of adjacent wordlines and the fourth pair of adjacent wordlines, wherein the first pair of adjacent wordlines and the third pair of adjacent wordlines are physically separated by the second pair of adjacent wordlines, and wherein the second pair of adjacent wordlines and the fourth pair of adjacent wordlines are physically separated by the third pair of adjacent wordlines.

11. The method of claim 10, further comprising:
determining that an error rate of at least one wordline of the first pair of adjacent wordlines satisfies a second error threshold criterion, and that an error rate of at least one wordline of the third pair of adjacent wordlines satisfies the second error threshold criterion, wherein the second error threshold criterion is less than the first error threshold criterion; and
performing a supplemental data integrity scan to determine one or more error rates corresponding to the second pair of adjacent wordlines.

12. The method of claim 11, further comprising:
determining whether at least one of the one or more error rates corresponding to the second pair of adjacent wordlines satisfies the first error threshold criterion; and
responsive to at least one of the one or more error rates corresponding to the second pair of adjacent wordlines satisfying the first error threshold criterion, relocating data stored in the segment to another segment on the memory device.

13. A non-transitory computer-readable storage medium comprising instructions that, when executed by a processing device, cause the processing device to:

determining an occurrence of a triggering event for a segment of a memory device;
determining a number of scan operations performed on the segment of the memory device; and
based on the number of scan operations performed on the segment of the memory device, identifying a first set of wordlines of the segment and performing a first data integrity scan to determine one or more first error rates corresponding to the first set of wordlines of the segment, the first set of wordlines comprising first alternating pairs of adjacent wordlines, wherein the first set of wordlines is interleaved with but excludes a second set of wordlines.

14. The non-transitory computer-readable storage medium of claim 13, wherein the instructions cause the processing device to perform operations further comprising:
determining whether at least one of the first one or more error rates satisfies a first error threshold criterion; and
responsive to at least one of the first one or more error rates satisfying the first error threshold criterion, relocating data stored in the segment to another segment of the memory device.

15. The non-transitory computer-readable storage medium of claim 14, wherein the segment comprises a first pair of adjacent wordlines, a second pair of adjacent wordlines, a third pair of adjacent wordlines, and a fourth pair of adjacent wordlines, the first set of wordlines comprising the first pair of adjacent wordlines and the third pair of adjacent wordlines, the second set of wordlines comprising the second pair of adjacent wordlines and the fourth pair of adjacent wordlines, wherein the first pair of adjacent wordlines and the third pair of adjacent wordlines are physically separated by the second pair of adjacent wordlines, and wherein the second pair of adjacent wordlines and the fourth pair of adjacent wordlines are physically separated by the third pair of adjacent wordlines.

16. The non-transitory computer-readable storage medium of claim 15, wherein the instructions cause the processing device to perform operations further comprising:
determining that an error rate of at least one wordline of the first pair of adjacent wordlines satisfies a second error threshold criterion, and that an error rate of at least one wordline of the third pair of adjacent wordlines satisfies the second error threshold criterion, wherein the second error threshold criterion is less than the first error threshold criterion; and
performing a supplemental data integrity scan to determine one or more error rates corresponding to the second pair of adjacent wordlines.

17. The non-transitory computer-readable storage medium of claim 16, wherein the instructions cause the processing device to perform operations further comprising:
determining whether at least one of the one or more error rates corresponding to the second pair of adjacent wordlines satisfies the first error threshold criterion; and
responsive to at least one of the one or more error rates corresponding to the second pair of adjacent wordlines satisfying the first error threshold criterion, relocating data stored in the segment to another segment on the memory device.

* * * * *